US008119261B2

(12) United States Patent
Vetter

(10) Patent No.: US 8,119,261 B2
(45) Date of Patent: Feb. 21, 2012

(54) LAYER SYSTEM FOR THE FORMATION OF A SURFACE LAYER ON A SURFACE OF A SUBSTRATE AND ALSO ARC VAPORIZATION SOURCE FOR THE MANUFACTURE OF A LAYER SYSTEM

(75) Inventor: Jörg Vetter, Bergisch Gladbach (DE)

(73) Assignee: Sulzer Metaplas GmbH, Bergisch-Gladbach (DE)

( * ) Notice: Subject to any disclaimer, the term of this patent is extended or adjusted under 35 U.S.C. 154(b) by 522 days.

(21) Appl. No.: 12/145,216

(22) Filed: Jun. 24, 2008

(65) Prior Publication Data
US 2009/0011257 A1 Jan. 8, 2009

(30) Foreign Application Priority Data

Jun. 25, 2007 (EP) .................................... 07110938

(51) Int. Cl.
*B32B 9/00* (2006.01)
(52) U.S. Cl. ............ 428/697; 51/307; 51/309; 428/698; 428/699; 428/701; 428/702; 428/704
(58) Field of Classification Search .................... 51/307, 51/309; 428/697, 698, 699, 701, 702, 704
See application file for complete search history.

(56) References Cited

U.S. PATENT DOCUMENTS

| | | | | |
|---|---|---|---|---|
| 6,824,601 B2 * | 11/2004 | Yamamoto et al. | ............ | 428/699 |
| 7,052,782 B2 * | 5/2006 | Bossmann et al. | ............ | 428/679 |
| 7,226,670 B2 * | 6/2007 | Derflinger et al. | ............ | 428/697 |
| 7,410,707 B2 * | 8/2008 | Fukui et al. | .................... | 428/698 |
| 7,695,829 B2 * | 4/2010 | Yamamoto et al. | ............ | 428/697 |
| 2004/0022662 A1 | 2/2004 | Lipkin et al. | | |

| | | |
|---|---|---|
| 2004/0185182 A1 | 9/2004 | Lipkin et al. |
| 2005/0042474 A1 | 2/2005 | Bossmann et al. |
| 2008/0075976 A1 | 3/2008 | Yamamoto et al. |

FOREIGN PATENT DOCUMENTS

| | | | |
|---|---|---|---|
| CA | 2523882 A1 | | 7/2004 |
| DE | 102007039193 A1 | | 4/2008 |
| EP | 560045 | * | 9/1993 |
| EP | 0560045 A1 | | 9/1993 |
| EP | 1391533 A1 | | 2/2004 |
| JP | 2004-106183 | * | 4/2004 |
| WO | 2004/059030 A2 | | 7/2004 |

OTHER PUBLICATIONS

European Search Report for Patent Application 07110938.3, Apr. 16, 2008.
European Search Report for Patent Application 08157310.7, Nov. 7, 2008.
European Examination Report for Patent Application 07110938.3, Jan. 30, 2008.

* cited by examiner

*Primary Examiner* — Archene Turner
(74) *Attorney, Agent, or Firm* — Robert S. Green

(57) ABSTRACT

The invention relates to a layer system for the formation of a surface layer on a surface of a substrate, in particular on the surface of a tool, wherein the layer system includes at least one first hard layer of the composition $(Al_aMg_bCr_cMe_dB_e\text{-}AX_mSi_k)_\alpha(N_uC_vO_w)_\beta$ with $(a+b+c+d+e+m+k)=\alpha$, $(u+v+w)=\beta$, and $(\alpha+\beta)=100$, wherein $40 \leq \alpha \leq 60$ and wherein Me is at least one element of the group of the chemical elements consisting of: the secondary groups IVb, Vb and VIb of the periodic system of the chemical elements. The component AX is at least one element of the group of the chemical elements consisting of: the elements of the main group Ia and the elements Be, Ca, Sr, Ba and the elements of the secondary groups VIIb, VIIIb, Ib, IIb, IIIb and the elements of the group of the lanthanoids, of the periodic system of the elements, wherein $0.004 \leq m < 60$, and preferably $0.01 \leq m < 50$. In accordance with the invention $0.4 \leq a \leq 58$ and $0.04 \leq b \leq 12$ and $18 \leq c \leq 42$.

29 Claims, No Drawings

_US 8,119,261 B2_

LAYER SYSTEM FOR THE FORMATION OF A SURFACE LAYER ON A SURFACE OF A SUBSTRATE AND ALSO ARC VAPORIZATION SOURCE FOR THE MANUFACTURE OF A LAYER SYSTEM

CROSS-REFERENCE TO RELATED APPLICATIONS

The present application claims priority under 35 U.S.C. §119 of European Patent Application No. 07110938.3 filed on Jun. 25, 2007, the disclosure of which is expressly incorporated by reference herein in its entirety.

STATEMENT REGARDING FEDERALLY SPONSORED RESEARCH OR DEVELOPMENT

Not applicable.

REFERENCE TO A COMPACT DISK APPENDIX

Not applicable.

BACKGROUND OF THE INVENTION

The invention relates to a layer system for the formation of a surface on a substrate, to a vaporization source for the manufacture of a layer system and also to a substrate, in particular to a tool having a layer system in accordance with the invention, all in accordance with the preambles of the independent claims of the respective categories.

The manufacture of performance tools and components is mainly realized by the coating of their surfaces. An important class of such coated substrates are tools, among other things in particular chip-forming tools and also components and machine parts for machines which are subject to wear in all possible embodiments. Typical substrate materials which are coated are among other things tool steels and hard metals but also all other possible substrate materials.

A known problem in the coating of these materials is that they have a relatively high oxidation rate in air at around 500° C. and soften at relatively low temperatures (ca. 500° C. for HSS and 650° C. for a hard metal).

Accordingly, ceramic cutting bodies are also preferably used, for example on the basis of cubic boron nitride for the hard machining of steels. Thus, the most diverse SiN ceramics are, for example, used for the high speed machining of aluminum alloys and grey cast ion. The ceramics prove to be substantially more durable in comparison to metallic tool materials. A further increase in performance can be achieved by suitable coating of the tools.

The hard material layers known from the prior art are in this respect frequently based on the classic compounds such as TiN, TiNC, CrN. These known hard layers do however have their limits with respect to their field of use above all with respect to their ability to work at high temperatures. On the one hand, the hardness drops off notably at elevated temperatures and, on the other hand, oxidation already sets in at relatively low temperatures and can lead to an increased layer wear at the temperature of use.

In order to avoid these problems essentially two layer classes have been developed which have oxidation resistance in the range up to 1000° C. and also have improved characteristics with respect to the hardness.

The one layer class relates to Al containing base layers such as AlTiN and AlCrN to which additional elements can be alloyed depending on the requirement. Typical compounds from this area are compounds of the form AlTiX-NCO, wherein X is, for example, Cr or another metal.

Another route followed in the prior art for the performance increase of coated tools consists in the combination of classic hard material layers as a carrier layer combined with finish layers as a functional layer. The high silicon containing layers (10 at-% or more); at-% signifies in the context of this application "atomic percent" of the type MeSiXNCO layer (X is further metals or B) are to be named, such as TiSN which have a significantly improved ability to withstand the temperature loading.

In addition it is furthermore known for example to deposit oxidic ceramic layers such as $Al_2O_3$ by means of CVD processes on indexable or reversible cutting inserts in order to be able to counteract wear processes at elevated contact temperatures in particular during turning.

In addition boron based layers such for example $B_4C$ and also cubic BN layers are at the stage of research. However, cubic BN has the decisive disadvantage that is extremely complicated to present. This is above all due to difficulties of the layer growth itself but also brought about by too high inherent stresses in the layers.

In the field of high temperature materials bulk ceramics on the basis of SiCN have been produced in recent years which are characterized by high hardness and an improvement of the resistance to oxidation in relation to SiC and $Si_3N_4$. Their special characteristics are based on the complex covalent chemical bonds and the low diffusion rate of oxygen in the amorphous structure of SiCN.

However, despite all previous efforts, the provision of coatings has only partly succeeded which are able to meet increasingly higher demands on the mechanical characteristics such as for example the hardness, residual compressive stress and toughness, tribological characteristics such as tendency to adhesion at higher temperatures and also friction, the oxidation resistance, phase stability and other characteristic properties, above all also at extreme temperatures.

Moreover, the above-described higher performance layers can also only be manufactured with great difficulties from the technical method view point and the tools coated therewith are very expensive, so that, however, when considered from the point of view economy, coating is in many cases not worth while or such coated tools only have a restricted market.

BRIEF SUMMARY OF THE INVENTION

An object of the invention is to make available improved coatings for a substrate, in particular for a tool or a part subjected to wear which overcomes the problems known from the prior art and has in particular a tribologically positively acting oxidation behavior and phase stability, improved mechanical properties, above all but not only with respect to the hardness and the residual compressive stress is and which can also be used under extreme temperature conditions.

Another object of the invention is to make available a vaporization source with which the new improved hard layers can be manufactured.

A layer system for the formation of a surface layer on a surface of a substrate, comprising: at least one first layer having the composition $(Al_aMg_bCr_cMe_dB_eAX_mSi_k)_\alpha (N_uC_vO_w)_\beta$ with $(a+b+c+d+e+m+k)=\alpha$, $(u+v+w)=\beta$, and $(\alpha+\beta)=100$, wherein $40 \leq a \leq 60$ and wherein Me is at least one metal of the group of the chemical elements consisting of: the elements of the secondary groups IVb, Vb, VIb of the periodic system of elements; wherein AX is at least one element of the group of the chemical elements consisting of: the elements of the main group IA, the elements Be, Ca, Sr and Ba, the elements of the secondary groups VIIb, VIIIb, Ib, IIb and IIIb, and the elements of the group of the lanthanoids of the periodic system of chemical elements; wherein $0.004 \leq m < 60$, $0.4 \leq a \leq 58$, $0.04 \leq b \leq 12$ and $18 \leq c \leq 42$. Additionally, in one embodiment, $0.01 \leq m < 50$.

In another embodiment, at least one of $20 \leq a \leq 42$, $0.02 \leq b \leq 6$, Me is present in a quantity corresponding to $4 \leq d \leq 54$ in the hard layer, and Si is present in a quantity of at most $k=24$ in the hard layer.

In another embodiment, AX is at least one of Li, Be, Ca and Si. In another embodiment, AX is at least one of Sc, Y and La. In still another embodiment, AX is at least one element of the group of the lanthanoids. In still another embodiment, AX is a mixed metal.

In another embodiment, the layer system includes at least one additional second layer of the composition $(M_oSi_pAY_q)\gamma(N_rC_sO_t)\delta$ with $(o+p+q)=\gamma$, $(r+s+t)=\delta$, and $(\gamma+\delta)=100$, wherein $40 \leq \gamma \leq 60$ and wherein M is at least one metal of the group of the chemical elements consisting of: Al and the elements of the secondary groups IVb, Vb, VIb of the periodic system of elements, wherein AY is at least one element of the group of the chemical elements consisting of: Mn, Fe, Co, Ni, Cu, the elements of the secondary group IIIB, the elements of the main group IA, IIA and IIIA and the elements of the group of the lanthanoids of the periodic system of chemical elements.

In another embodiment, AY further contains boron. In still another embodiment, AY is an element of the group of the chemical elements consisting of Y and the lanthanoids. In another embodiment, AY is an element of the group of the chemical elements consisting of Y and at least one of Ce and La.

In another embodiment, at least one of $0.04 \leq p \leq 30$, $0.004 \leq q \leq 6$, and $0.01 \leq q \leq 10$.

In another embodiment, the first hard layer is a terminal cover layer of the layer system. In still another embodiment, the second hard layer is a terminal cover layer of the layer system.

In another embodiment, the layer system further comprises a functional layer, and the functional layer is a composite layer, and the functional layer is on a surface of the substrate.

In another embodiment, the functional layer is a composite layer of $Met_xE_yN_z$, with $x>0$; $y \geq 0$ and $z>0$, wherein Met is at least one metal of the group Al, Cr, Mo, W, V, Nb, Ta, Ti, Zr, Hf, Mn, Fe; Co, Ni, Li, Be, Mg, Sc, Y, La, Ce, Nd, Sm; and wherein E is an element of the group Si, B, C, O.

In still another embodiment, the layer system further comprises at least one of an intermediate layer and a gradient mixed layer, wherein an intermediate layer comprises at least one of Si and C, and wherein the gradient mixed layer comprises the at least one of Si and C of the intermediate layer, the composition $(Al_aMg_bCr_cMe_dB_eAX_mSi_k)_\alpha(N_uC_vO_w)_\beta$ of the first layer, and the composition $(M_oSi_pAY_q)_\gamma(N_rC_sO_t)_\delta$ of the second layer.

An arc vaporization source having a vaporization material as cathode for the generation of a surface layer on a surface of a substrate by vaporization of the vapor material by means of an arc discharge on a vaporization surface of the cathode, wherein the vaporization material has a chemical composition $(Al_aMg_bCr_cMe_dB_eAX_mSi_k)$ with $(a'+b'+c'+d'+e'+m'+k')=100$, wherein Me is at least one element of the group of the chemical elements consisting of the secondary groups IVb, Vb and VIb of the periodic system of the chemical elements, and wherein AX is at least one element of the group of the chemical elements consisting of the elements of the main group Ia, the elements Be, Ca, Sr, Ba, the elements of the secondary groups VIIb, VIIIb, Ib, IIb, IIIb and the elements of the group of the lanthanoids of the periodic system of the chemical elements, wherein $0.01 \leq m' < 100$, wherein $1 \leq a' \leq 97$, $0.1 \leq b' \leq 20$ and $30 \leq c' \leq 70$.

In another embodiment, the vaporization material further comprises at least one of C, N and O.

In another embodiment, AX is at least one of Li, Be, Ca and Si, or wherein AX is at least one of Sc, Y and La, or wherein AX is at least one element of the group of the lanthanoids, or wherein AX is a mixed metal.

An arc vaporization source having a vaporization material as a cathode for the generation of a surface layer on a surface of a substrate by vaporization of the vaporization material by means of an arc discharge on a vaporization surface of the cathode, wherein the vaporization material has a chemical composition $(M_oSi_pAY_q)$ with $(o'+p'+q')=100$, and wherein M is at least one metal of the group of the chemical elements consisting of Al and the elements of the secondary groups IVb, Vb, VIb of the periodic system of the elements and wherein AY is at least one element of the group of the chemical elements consisting of Mn, Fe, Co, Ni, Cu, the elements of the secondary group IIIB, the elements of the main group IA, IIA and IIIA and the elements of the group of the lanthanoids of the period system of the chemical elements.

In another embodiment, a substrate coated with a layer system, wherein the substrate is at least one of an original tool, a master tool, a mould, a press tool, a chip forming tool, a drill, a milling cutter, an indexable cutting insert, a planing tool, a reshaping tool, a micro-tool, a micro drill, a micro indexable cutting insert, a micro miller, a plastic tool, and a substrate of a part; wherein the substrate is a part subjected to wear from at least one of an air-based turbine, a land-based turbine, a motor, a combustion engine, a seal, a gear, a piston, a piston ring, a part subjected to wear in a textile machine, and a part generally subjected to wear.

BRIEF DESCRIPTION OF THE DRAWINGS

Not Applicable

DETAILED DESCRIPTION OF THE INVENTION

The invention thus relates to a layer system for the formation of a surface layer on a surface of a substrate, in particular on the surface of a tool, wherein the layer system includes at least one first hard layer of the composition $(Al_aMg_bCr_cMe_dB_eAX_mSi_k)_\alpha(N_uC_vO_w)_\beta$ with $(a+b+c+d+e+m+k)=\alpha$, $(u+v+w)=\beta$, and $(\alpha+\beta)=100$, wherein $40 \leq a \leq 60$ and wherein Me is at least one element of the group of the chemical elements consisting of the secondary groups IVb, Vb and VIb of the periodic system of the chemical elements. The component AX is at least one element of the group of the chemical elements consisting of the elements of the main group Ia, the elements Be, Ca, Sr and Ba. The elements of the secondary groups VIIb, VIIIb, Ib, IIb, IIIb and the elements of the group of the lanthanoids, of the periodic system of the elements wherein $0.004 \leq m < 60$, and preferably $0.01 \leq m < 50$. In accordance with the invention $0.4 \leq a \leq 58$ and $0.04 \leq b \leq 12$ and $18 \leq c \leq 42$.

This formulation is equivalent to saying that the layer system is for the formation of a surface layer on a surface of a substrate, in particular on the surface of a tool with the layer system having at least one hard layer of the composition $(Al_aMg_bCr_cMe_dB_eA_mSi_k)G$ with a $(a+b+c+d+e+m+k)=100$ and G being at least one element of the group of the chemical elements consisting of N, C and O. Me is at least one element from the group of the chemical elements consisting of the secondary groups IVb, Vb and VIb of the periodic system of the chemical elements and A is at least one element of the group of chemical elements consisting of the elements of the main groups Ia, IIa and the elements of the secondary groups VIIb, VIIIb, Ib, IIb, IIIb and the elements of the group of the lanthanoids of the periodic system of elements, with $0.01 \leq m < 100$. In accordance with the invention $1 \leq a \leq 97$ and $0.1 \leq b \leq 20$ and $30 \leq c \leq 70$. In this formulation the sum $(a+b+c+d+e+m+k)$ is related 100 and not as in claim 1 of the present application to $\alpha$. Although the formulation $(a+b+c+d+e+m+k)=100$ is essentially identical to $(a+b+c+d+e+m+k)=\alpha$, insofar as the group G is not specified more closely, $(a+b+c+d+e+m+k)=100$ can, in cases of doubt, lead to a lack of clarity so that in the following the clearer formulation $(a+b+c+d+e+m+k)=\alpha$ will be used.

For the sake of better distinction the symbol AX will moreover be used in place of the symbol A for the component A in the formula unit $(Al_a Mg_b Cr_c Me_d B_e A_m Si_k)$.

The considerably improved performance of the tools and components in comparison to the prior art is thus achieved in accordance with the invention in that the corresponding substrates are coated with a hard layer of the composition $(Al_a Mg_b Cr_c Me_d B_e AX_m Si_k)G$, with G being a composition known per se of at least one element of the group of nitrogen (N), carbon (C) and oxygen (O) and thus for example standing for $(N_u C_v O_w)_\beta$ and Me is at least one metal of the group of the chemical elements consisting of the elements from the secondary groups IVb, Vb, VIb of the periodic system of elements and A is at least one element of the group of the chemical elements consisting of the elements of the main groups Ia, IIa, and the elements of the secondary groups VIIb, VIIIb, Ib, IIb, IIIb, and the elements of the groups of the lanthanoids of the periodic system of elements.

The significantly improved characteristics of the layer systems of the invention, above all with respect to hardness, residual compressive stresses, resistance to oxidation and phase stability at the temperatures up to 1200° C. and more could be achieved in that, in accordance with the invention, the proportion of aluminum (Al) is restricted $0.4 \leq a \leq 58$ and at the same time the proportion of magnesium (Mg) is restricted to $0.04 \leq b \leq 12$ and the proportion of chrome (Cr) to $18 \leq c \leq 42$.

The secondary groups IVb, Vb, VIb, from which the metal Me can be selected consists of the elements titanium (Ti), zirconium (Zr), hafnium (Hf) of the group IVb, of the elements vanadium (V), niobium (Nb), tantalum (Ta) of the group Vb and of chrome (Cr), molybdenum (Mo) and tungsten (W) of the secondary group VIb of the period system of elements.

The main groups Ia and IIa of the periodic system of elements from which the formula AX can be selected in a known manner from the elements hydrogen (H), lithium (Li), sodium (Na), potassium (K), rubidium (Rb), caesium (Cs) and francium (Fr) of the main group Ia and of the elements beryllium (Be), magnesium (Mg) calcium (Ca), strontium (Sr), barium (Ba) and radium (Ra) of the Group IIa.

The secondary group Ib consists of the chemical elements copper (Cu), silver (Ag), Gold (Au) and terbium (Tb), the secondary group IIb consists of the chemical elements zinc (Zn), cadmium (Cd), mercury (Hg) and dysprosium (Dy), whereas the secondary group IIIb consists of the chemical elements scandium (Sc), yttrium (Y), lanthanum (La) and actinium (Ac).

The further secondary groups VIIb and VIIIb from which the component AX of the formula unit $(Al_a Mg_b Cr_c Me_d B_e AX_m Si_k)$ can likewise be selected, consists of the chemical elements manganese (Mn), technetium (Tc), rhenium (Re) of the secondary group VIIb and iron (Fe), ruthenium (Ru), osmium (Os), cobalt (Co), rhodium (Rh), iridium (Ir), nickel (Ni), palladium (Pd) and platinum (Pt) of the secondary group VIIIb of the periodic system of chemical elements.

In known manner the chemical elements cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu) belong to the group of the lanthanoids.

It has now been shown in a surprising manner that the hard layers known from the prior art which have the initially mentioned disadvantages such as in particular lack of resistance to oxidation and lack of phase stability, above all at higher temperatures, such as are for example very frequently to be encountered with high performance tools in the operating state, can be decisively improved by the above quoted restricted of the content of aluminum, magnesium and chromium in the compound of the invention $(Al_a Mg_b Cr_c Me_d B_e AX_m Si_k)G$. By suitable choice of the chemical compositions through the present invention one has for the first time succeeded in simultaneously optimizing the resistance to oxidation, the phase durability, hardness, residual compressive stress and other decisive parameters such as for example the bond strength in a $(Al_a Mg_b Cr_c Me_d B_e AX_m Si_k)G$ layer.

In this connection, and thus unless otherwise expressly mentioned, the statements of quantity indicated in the context of this application by indices at the chemical elements or at the symbols representing the chemical elements are to be understood throughout as atomic-% (at-%). That is to say that, for example, the statement $0.01 \leq m < 100$ with $(a+b+c+d+e+m+k)=100$ signifies that the components $A_m$ in the formula unit $(Al_a Mg_b Cr_c Me_d B_e AX_m Si_k)$ is present in an amount between 1 at-% and 50 at-%.

It has in particular been shown that the layers of the layer system of the invention can also advantageously be combined with already known layers in the layer system to form new layer systems so that completely new layer systems can be made available by the present invention in comparison to the prior art which have characteristics in comparison to the prior art which have been improved in almost every respect.

Thus, in a layer system in accordance with the invention different layers which can have quite different functions can be excellently combined in a layer system in accordance with the invention with a first hard layer without for example problems arising with the bond strength between the layers or on the substrate and without the layer system in accordance with the invention deteriorating in the course of time, for example by undesired diffusion processes or other physical chemical reactions or failing at high temperatures and large mechanical loadings in the operating state. The conventional layer known from the prior art such as for example layers of the classical compounds such as TiN, TiNC, CrN and others are also able to be combined advantageously with a first hard layer in accordance with the invention depending on the requirements.

The part layers of a first hard layer with the chemical composition $(Al_a Mg_b Cr_c Me_d B_e AX_m Si_k)G$ of a layer system in accordance with the invention can also take on the most diverse functions by a suitable specific choice of the content of Al, Mg and chromium. Thus, an $(Al_a Mg_b Cr_c Me_d B_e AX_m Si_k)G$ layer in accordance with the invention can in one case be a bond layer which produces an excellent bond of the total layer system to the substrate in that it for example matches the grid parameters of the substrate to the further layer system or in that the special chemistry of the substrate is matched to that of the further layer system.

An $(Al_aMg_bCr_cMe_dB_eAX_mSi_k)G$ layer in accordance with the invention can however also form an intermediate layer with the functions known per se, for example in a modified chemical composition in a layer system or, however, also be a covering first hard layer which protects the substrate, for example a tool or part subjected to wear against thermal, mechanical and chemical attacks.

In an example important in practice the component AX is a mixed metal.

The use of at least one rare earth element has proved advantageous as the component AX for the formation of a mixed metal. The group of the rare earth elements includes in this respect in known manner the lanthanoids and also lanthanum, scandium and yttrium. In this connection the pure elements of the group of the rare earths are indeed entirely different with respect to specific characteristics, for example with respect to the melting and vaporization points, the vapor pressure etc., however these elements are if any thing very similar rather than different with respect to their chemical properties and this already manifests itself in the fact that their separation causes great difficulties in practice.

Thus, the rare earths are frequently also used in the form of the said mixed metals, i.e. it is not pure metals of the group of the rare earths that are used for alloying processes for example, but rather specific mixtures which contain two or more elements of the group of the rare earths and possibly also further different chemical elements in predeterminable quantities. In this connection it is known that the addition of very small quantities of mixed metals can massively influence the chemical and physical characteristics of a basic substance depending on the composition.

It has in this respect been shown that the use of mixed metals as a component of the chemical component AX can lead to a situation in which even the smallest quantities of mixed metals can enormously influence the desired characteristics of a layer system in accordance with the invention without corresponding serious changes having to be tolerated for example in the chemical properties or in the lattice structure. In this connection the definition of the "mixed metal" is not absolutely unambiguous in the literature. In the context of the present application the term "mixed metal" will however be understood with a very broad technical significance.

In a very narrow definition, which is simply used as a specific example for specific mixed metal, and which in no way restricts the significance of the term "mixed metal" for the present application, a mixed metal, also a cerium mixed metal, is a metal alloy of metals of the rare earths. It consists for example to 45% to 52% of cerium, to 20% to 27% of lanthanum, to 15% to 18% of neodymium, to 3% to 5% of praseodymium and to 1% to 3% of samarium, terbium and yttrium, traces of other rare earth metals, calcium and silicon and up to 5% of iron. The composition can for example result directly from the starting mineral monazite. If the proportion of iron exceeds 15% (mainly up to 50%) one frequently also speaks of cerium iron.

As a result of the similarity of the chemical properties of the rare earths deviations in the composition are uncritical for specific properties whereas other properties can indeed be really influenced by a change of the chemical composition.

Mixed metals can reduce unwanted iron oxides as an additive during the manufacture of steel, they can bind oxygen and sulphur and assist the degassing. As alloying metals they can help improve the casting and flow properties and also the corrosion resistance of iron-chrome-aluminum materials in hot oxidizing gases.

The following Table 1 shows five special examples of mixed metals, with the definition of the term "mixed metal" being significantly stretched for the examples of the Table 1. Thus the mixed metals of the Table 1 include, in addition to different rare earths also other additives and indeed both metals and also non-metals such as Fe, Si, Mg, S and phosphorus. Other elements such as hafnium (Hf), cobalt (Co), zirconium (Zr), nickel (Ni) and further elements of the periodic system can also be present in a mixed metal.

However, as already mentioned, the Table 1 is only to be understood as an example for the significance of the term "mixed metal" in the context of this application and in no way acts restrictively for the class of the very different mixed metals which can be advantageously included by the component AX in a layer system in accordance with the invention.

TABLE 1

|    | Mixed metal 1 | Mixed metal 2 | Mixed metal 3 | Mixed metal 4 | Mixed metal 5 |
| --- | --- | --- | --- | --- | --- |
| La | 25-33% | 25-34% | 25-34% | 30-40% | 44-50% |
| Ce | 48% min. | 48-55% | 48-55% | 60-70% | 50-56% |
| Pr | 4-7% | 4-6% | 4-6% | 0.5% max. | 0.1% max. |
| Nd | 11-15% | 14-17% | 14-17% | 0.5% max. | 0.1% max. |
| Fe | 0.5% max. | 0.2% max. | 0.5% max. | 0.5% max. | 0.5% max. |
| Si | 0.2% max. | 0.05% max. | 0.2% max. | 0.2% max. | 0.2% max. |
| Mg | 0.5% max. | 0.05% max. | 0.5% max. | 0.5% max. | 0.5% max. |
| S | 0.02% max. | 0.02% max. | 0.02% max. | 0.02% max. | 0.02% max. |
| P | 0.01% max. | 0.01% max. | 0.01% max. | 0.01% max. | 0.01% max. |

The proportion of aluminum (Al) is advantageously selected to lie in the rage $20 \leq a \leq 42$ and the proportion of magnesium (Mg) in the range from $0.02 \leq b \leq 6$. It has in particular being shown that the choice of the proportion of La and Mg in the named range leads to a good compromise in the optimization of the resistance to oxidization and phase durability with a simultaneous increase of the hardness, residual compressive stress and toughness of the layers, with it also being possible to achieve good tribological properties in addition.

The metals Me of the secondary groups IVb and/or Vb and/or VIb are preferably present in a quantity corresponding to $4 \leq d \leq 54$ in a first hard layer. Through this choice of the composition a further increase of the hardness can be achieved in comparison to the hard layers known from the prior art, with it being possible to achieve optimization of the nitride formation by a suitable choice of the specific composition of the metal group Me depending on the use of the layer.

In a special case Si is present in a quantity of at most k=24 in the first hard layer. Whereas nitrogen (N) contributes among other things substantially to the hardness of the layer system and silicon (Si) is important for the resistance to oxidation, the additional use of boron (B) leads to the resistance of the structure to thermal loadings being significantly improved.

Through the setting of the silicon content to the named range it is for example possible to simultaneously further optimize the resistance to oxidation and the toughness and/or hardness of the layer within specific limits, but not only these and/or in addition to other measures.

In very special cases, when (for example) for specific reasons the chemical elements which form a component AX tend to have a smaller atomic diameter or when specific chemical boundary conditions are to be satisfied, the component AX can be formed exclusively only of Li and/or of Be and/or of Ca and/or of Si.

In this connection, further special cases are possible for similar or other reasons. Thus AX can in another case also only be Sc and/or only Y and/or only La, or AX can be only at least one element of the group of the lanthanoids, in particular only Ce and otherwise include no other element.

In the following some exemplary embodiments of layer systems in accordance with the invention will be discussed which were first manufactured for the sake of simplicity as one layer systems of the first hard layer for the determination of the specific layer parameters. It will be understood that not only the following layer systems but rather in particular also all examples presented in the context of this application can also be advantageously combined.

In one embodiment an AlCrMgSiN layer was investigated.

This first hard layer was applied in a manner known per se by means of an arc vaporization source in a corresponding process chamber which is likewise known to the person skilled in the art. One used arc vaporization source, often only simply termed a cathode, has a diameter of 100 mm and the following chemical composition apart from technically unimportant contaminants: 68 at-% Al, 29.5 at-% Cr, 1.5% at-% Mg and 1 at-% Si.

The composition of the applied layer was then determined in the following manner:

REM: LEO, EDX: INCA, acceleration voltage 15 keV.

This investigation resulted in the following composition of the layer applied to the substrate: 64.03 at-% Al, 33.93 at-% Cr, 1.08 at-% Si and 0.96 at-% Mg.

For the coating, a substrate, in the present case a high speed steel, was first heated in the process chamber to circa 500° C. subjected to ion cleaning and subsequently coated in pulsed manner at a gas pressure of approximately 6.5 Pa at a cathode current of ca. 150 Amps and with a bias voltage of ca. 50 V.

For the comparison an AlTiN layer known from the prior art was manufactured, with a cathode being used having 55 atomic-% Al and 45 Atom-% Ti.

The required nitrogen was made available for both layers via the process gas in the process chamber.

The following Table 2 compares the most important layer properties of the two so produced layers.

TABLE 2

|  | AlTiN | AlCrMgSiN |
| --- | --- | --- |
| Micro-hardness Knoop [HK0.025] | 2500 | 2850 |
| Wear rate [$m^2/(Nm)$] | 2.9 | 1.9 |
| Surface resistance [Ohm] | 10 | 27.250 |

The micro-hardness in accordance with Table 2 was in this connection determined in known manner in accordance with the method of Knoop and the wear rate was measured via the abrasion resistance with a KALOTEST with kalo-MAX NT of the company BAQ with a ball diameter of 30 mm and 540 shaft rotations at 60 rpm using a grinding emulsion. The surface resistance was measured with a multimeter with a spacing between the measuring tips of ca. 10 mm.

Table 2 demonstrates a significantly greater hardness and a wear rate reduced by circa one third for the AlCrMgSiN layer of the invention in comparison to the known AlTiN layer of the prior art. The enormously high surface resistance of the AlCrMgSiN layer of the invention is notable and is approximately 3000 times larger than that of the known AlTiN layer. This makes the layer of the invention particularly interesting, above all for fields of use in which the flow of surface currents must be prevented or reduced or the creation of magnetic and electric fields as a result of surface currents must be suppressed or prevented. Thus the layer in accordance with the invention is in particular also particularly well suited for applications in which corresponding electromagnetic and in particular dielectric characteristics of the layer play a role.

In a further embodiment which is very important in practice a layer system in accordance with the invention includes at least one additional hard layer of the composition $(M_kSi_lA_m)G$ with $(k+l+m)=100$, with G being at least one element of the group of the chemical elements consisting of N, C and O. In this connection M is at least one metal of the group of the chemical elements consisting of Al and the elements of the secondary groups IVb, Vb, and VIb of the periodic system of the elements. The component A of the second hard layer is at least one element of the group of the chemical elements consisting of Mn, Fe, Co, Ni, Cu and the elements of the secondary group IIIb and the elements of the main groups Ia, IIa, IIIa and the elements of the group of the lanthanoids of the periodic system of the chemical elements.

That is essentially identical with the statement that the layer system includes at least one additional second hard layer of the composition $(M_oSi_pAY_q)\gamma(N_rC_sO_t)\delta$ with $(o+p+q)=\gamma$, $(r+s+t)=\delta$, and $(\gamma+\delta)=100$, wherein $40\leq\gamma\leq60$ and wherein M is at least one metal of the group of the chemical elements consisting of Al and the elements of the secondary groups IVb, Vb, VIb of the periodic system of elements. The component AY is at least one element of the group of the chemical elements consisting of Mn, Fe, Co, Ni, Cu and the elements of the secondary group IIIB and the elements of the main group IA, IIA and IIIA and the elements of the group of the lanthanoids of the periodic system of chemical elements.

For the sake of better distinction the symbol A in the formula unit $(M_kSi_lA_m)$ is replaced by the symbol AY in the formula unit $(M_oSi_pAY_q)\gamma$.

A further considerably improved performance of the tools and components in comparison with the prior art was thus achieved in that the corresponding substrates were coated with an additional second hard layer of the composition $(M_kSi_lA_m)G$ more precisely $(M_oSi_pAY_q)\gamma(N_rC_sO_t)\delta$ with G thus being a composition known per se of at least one element of the group nitrogen (N), carbon (C) and oxygen (O), i.e. G has for example the chemical structure $(N_rC_sO_t)\delta$ and M is at least one metal of the group of the chemical elements consisting of aluminum (Al) and the elements of the secondary groups IVb, Vb, VIb of the periodic system of elements.

The characteristics of a layer system in accordance with the invention with a second hard layer which have been significantly improved once again, above all with respect to the hardness, residual compressive stresses, resistance to oxidation and phase stability up to temperatures of 1200° C. and more could be achieved in that the component AY supplements the chemical composition of the second hard layer, with AY being supplemented by at least one element of the group of the chemical elements consisting of manganese (Mn), iron(Fe), cobalt (Co), nickel (Ni), copper (Cu) and elements of the secondary group IIIB, the elements of the main group IA, IIA, IIIA and the elements of the group of the lanthanoids of the periodic system of the chemical elements.

In manner know per se the main group IIIa of the periodic system of the elements consists in this respect of the elements boron (B), aluminum (Al), gallium (Ga), indium (In) and thallium (Tl).

The use of at least one rare earth element for the component AY of the second hard layer has proved to be particularly advantageous. In this connection it has been found that the addition of very small quantities of mixed metals can already massively influence the chemical and physical properties of a second $(M_kSi_lA_m)G$ hard layer, depending on the composition.

In a surprising manner it has in addition being shown that, through the addition of the component AY to the second hard layer in the form of one or more rare earth elements and/or of one or more elements of the main group IA and/or IIA and/or IIIA these properties can be decisively improved, the present invention having succeeded for the first time, by a suitable choice of the chemical compositions, in still further improving and optimizing the resistance to oxidation, the phase durability, the hardness and other decisive parameters such as for example the bond strength and the residual compressive stresses.

In particular it has also been shown that the layers of the type of the second hard layer can advantageously be combined with already known layers and layer systems to form new layer systems so that through the present invention completely new layer systems can be made available with properties improved in almost every respect in comparison to the prior art.

This is in particular due to the fact that for a suitable choice of the chemical elements which form the component AY in the layer system $(M_kSi_lA_m)G$ i.e. $(M_oSi_pAY_q)_\gamma(N_rC_sO_t)_\delta$ in accordance with the invention, the layer system of the present invention achieves an enormous flexibility because, for example, a large selection of atomic diameters is available for the component AY of the second hard layer, whereby, for example, lattice parameters can be matched without negatively influencing the chemical bonding possibilities.

The part layers can also include a second part layer with the chemical composition $(M_oSi_pAY_q)_\gamma(N_rC_sO_t)_\delta$ of a layer system in accordance with the invention and also take on the most diverse functions by a suitable choice of the chemical composition of the component AY. Thus a second $(M_oSi_p AY_q)_\gamma(N_rC_sO_t)_\delta$ hard layer can for example in one case be a bond layer which produces an excellent adhesion of the total layer system to the substrate in that it matches for example the lattice parameter of the substrate to the further layer system, or in that the special chemistry of the substrate is matched to that of the further layer system.

A second $(M_oSi_pAY_q)_\gamma(N_rC_sO_t)_\delta$ hard layer can however also form an intermediate layer with the functions known per se in a modified chemical composition in a layer system or, however, also be a covering first hard layer which protects the substrate, for example a tool or a part subjected to wear against thermal, mechanical or chemical attacks.

In a preferred embodiment the component A of the second hard layer can additionally contain boron (B). Whereas nitrogen (N) contributes amongst other things significantly to the hardness of the layer system and silicon (Si) is important for the resistance to oxidation, the resistance of the structure to thermal loads can be significantly improved still further by the additional use of B.

It is preferable, but not necessary, for the proportion of Si in the second hard layer to be set to a range of $0.04 \leq p < 30$.

By the setting of the silicon content to the named range it is, for example, possible to simultaneously optimize the oxidation resistance and the toughness or hardness as well as the residual compressive stresses of the second hard layer, and thus of the total layer system in accordance with the invention, within predeterminable limits or to optimize them in addition to other measures.

The proportion of the chemical component AY in the formula unit $(M_oSi_pAY_q)_\gamma(N_rC_sO_t)_\delta$ of the second hard layer thereby preferably lies in the range $0.004 < q < 6$ and, as already mentioned, the statement should naturally be understood as atomic percent.

Through the choice of the component AY of a second hard layer in the named range it is possible as has been shown, to further improve the phase durability by a layer system in accordance with the invention, in addition to further parameters, even at very high temperatures and even above 1200° C.; however, the oxidation resistance can also be thereby further increased and relevant lattice parameters can simultaneously be matched so that a desired inherent stress level of the layer system can be set and, in addition, the hardness of the layer system can be further increased.

As already mentioned the component AY of the second hard layer is preferably, but not necessarily, an element of the group of the rare earths, in particular an element of the group of the chemical elements consisting of Y and the lanthanoids, in particular Ce and/or La which brings about the advantages of the layer system in accordance with the invention as described in detail further above.

As already mentioned a component AY of the second hard layer can also include a mixed metal and it has been shown that the use of mixed metals as a component of the chemical component AY can lead to a situation in which even the smallest quantities of mixed metals can enormously influence the desired properties of a layer system in accordance with the invention without correspondingly serious changes, for example in the chemical composition or in the lattice structure having to be tolerated.

In very special cases, when for example the chemical elements which form the component AY of the second hard layer should for specific reasons tend to have if anything a smaller atomic diameter, or when specific chemical and/or physical boundary conditions are to be satisfied, the component A can be formed exclusively only of Be and/or only of Ca.

In this respect, for analogous or similar reasons or other reasons further special cases are also possible. Thus the component AY of the second hard layer can in another case also be only Sc and/or Y and/or La and/or AY can be only at least one element of the group of the lanthanoids, in particular only Ce and otherwise not include any other element.

In the following some exemplary embodiments of layer systems in accordance with the invention with a second hard layer will be discussed and, for the sake of simplicity, only single layer systems of the second hard layer were manufactured for the determination of specific layer parameters.

It will be understood that not only the following layer systems but rather in particular all embodiments presented in the context of this application can also be advantageously combined in many ways.

In the following a second TiSiN hard layer will be discussed, which in an embodiment in accordance with the invention contains a proportion of a cerium mixed metal. The layer was applied in a manner known per se by means of an arc vaporization source in a corresponding process chamber which is likewise known to the person skilled in the art. An arc vaporization source that is used, often simply termed a cathode, has in the present example a diameter of 100 mm and, apart from the technically unimportant contaminants the following chemical composition: 82.5 at-% Ti, 17 at-% Si, 0.5 at-% cerium mixed metal $(Ce_M)$, with the cerium mixed metal consisting to 54% by weight of Ce, to 29% by weight of La, to 13% by weight of Nd and to 4% by weight of Pr.

For the coating, a substrate, in the present case a high speed steel, was first heated in the process chamber to 500° C., subjected to ion cleaning and was subsequently coated at a gas pressure of approximately 5 Pa, at a cathode current of ca. 130 A and at a bias voltage of ca. 50 V.

For the comparison an AlTiN layer known from the prior art was manufactured under the same coating conditions and for which a cathode with 55 atomic-% Al and 45 atomic-% Ti was used. The nitrogen required was made available for both layers via the process gas in the process chamber.

The following Table 3 shows a comparison of the most important layer characteristics of the two layers that are produced. In this connection $Ce_M$ in Table 3 signifies a cerium mixed metal as previously defined.

TABLE 3

|  | AlTiN | $TiSiCe_MN$ |
| --- | --- | --- |
| Micro-hardness Knoop [HK0.025] | 2226 | 4093 |
| Wear rate [m²/(Nm)] | 8.09 | 3.59 |

The micro-hardness in accordance with Table 3 was determined in known manner in accordance with the method of Knoop and the wear rate via the abrasion resistance with a KALOTEST N apparatus of the company BAQ having a ball diameter of 30 mm and 540 shaft rotations at 60 rpm using a grinding emulsion.

The Table 3 demonstrates in impressive manner for the $TiSiCe_MN$ layer in accordance with the invention a hardness which is almost twice as high and a wear rate which is less than half as large in comparison to the AlTiN layer known from the prior art.

In X-ray diffraction investigations a clearly preferred (200)-orientation of the lattice could be observed for the layers in accordance with the invention while (111)-orientations were practically not observed.

As already mentioned the first hard layer can, in a preferred embodiment of a layer system in accordance with the invention, be a terminating cover layer of the layer system, whereas in another embodiment the second hard layer forms a terminating cover layer of the layer system.

In the special case a layer system in accordance with the invention can include a functional layer, in particular a composite layer, preferably a composite layer of $Met_xE_yN_z$, with x>0; y≧0 and z>0, with Met being at least one metal from the group Al, Cr, Mo, W, V, Nb, Ta, Ti, Zr, HF, Mn, Fe; Co; Ni, Li, Be, Mg, Sc, Y, La, Ce, Nd, Sm and E being an element from the group Si, B, C, O.

In this connection an intermediate layer can for example be provided comprising the elements Si and/or C and/or a gradient mixed layer is provided which includes the elements Si and/or C of the intermediate layer and the composition $(Al_aMg_bCr_cMe_dB_eAX_mSi_k)_\alpha(N_uC_vO_w)_\beta$ of the first hard layer and/or the composition $(M_oSi_pAY_q)_\gamma(N_rC_sO_t)_\delta$ of the second hard layer.

In a special case the proportion of the metallic components of the layer can be minimized or missing altogether in the functional layer so that Si/B dominating layers are additionally provided in a layer system in accordance with the invention as the functional layer.

As a result of the complicated manufacture relatively little has been known hitherto concerning SiBx ceramics. For $SiB_6$ the following particulars are for example present for bulk materials in front of an ortho-rhombic grid, hardness ca. 2600, modulus of elasticity 290 GPa, density 2,43 g/cm³, thermal coefficient expansion 4,6*10⁻⁶/° C., thermal conductivity 9 W/mK, melting point 1950° C. In particular the high oxidation resistance will be emphasized: stable in air up to 1550° C.

This stability of SiBx ceramics at high temperatures is not achieved by the classic layer systems such as AlTiN, AlCrSiN and TiSiN. Such bulk properties are to be found in similar form in layers of the type SiBx with respect to the hardness and the oxidation properties, with the realization of these layers by means of PVD coating having industrial relevance.

The mechanism of the oxidation protection of the SiBx functional layers relates in this respect to the formation of a double layer of the type SiO/BO. The outer Si-rich layer which arises prevents the diffusion of oxygen into the layer.

It has thus already been proposed to use the new coating material class SiBx, and especially the new coating material class SiBCN, as a coating material for tools. In particular it has been shown that a functional layer on the basis of SiB compounds, or of SiBNC in combination with the known classic hard material layers likewise leads to the significantly improved layer characteristics, it is proposed with the present invention to likewise integrate such functional layers, if necessary, into a layer system of the present invention.

Depending on the requirement placed on the substrates or tools to be coated it can in a special case be advantageous to dope the functional layers in a layer system in accordance with the invention with oxygen and thus for example to achieve SiBNCO layers, which among other things reduce the diffusion of oxygen by pre-oxidation or by refinement of the structure of the layers and also massively increase the oxidation resistance at high temperatures.

The doping of the functional layer with oxygen leads moreover to an occupation of the grain boundaries with oxygen, so that at least with a partial formation of the above-named or other double layer systems the tendency to structure conversion in the layer systems, which often have a more or less open porosity or layer defects is reduced since a pre-oxidation is induced by the doping with oxygen.

In accordance with the present invention it is in this respect decisive that the functional layers have at least the two elements Si and B, in particular so that protective double layers can form. That is to say a layer system in accordance with the invention can have at least one functional layer of the composition $Si_aB_bMe_cN_uC_vO_w$ with a,b>0 and 33 at-%>c≧0 and u,v,w≧0 with Me being a metal which, in a special case, can for example be a metal, for example Al or SiC, used for the target manufacture for the deposition of the layer in accordance with the invention or can however be an intentionally incorporated metallic element.

The functional layers of a layer system in accordance with the invention can in this respect preferably be deposited on suitable metallic intermediate layers but also on Si, SiC intermediate layers and also onto a first hard layer or onto a second hard layer in accordance with the present invention and can also be directly deposited on metallic or ceramic tool materials or preferably on tool materials coated with hard material layers.

Preferably, but not necessarily, the functional layers of a layer system in accordance with the invention are present in a largely amorphous state, wherein, in a special embodiment, a formation of nano-crystalline regions in the functional layers can be present.

The layer thicknesses of the functional layers lie in this connection in the range between ca. 5 nm-50 000 nm, in a special case between 10 nm and 2500 nm, preferably between (100-500) nm and can as an under-layer include for example aluminum base hard material layers deposited in the same or in separate plants.

The metallic component Me of a functional layer is in this respect one metal from the group Al, Cr, Mo, W, V, Nb, Ta, Ti, Zr, HF, Mn, Fe; Co; Ni, Li, Be, Mg, Sc, Y, La, Ce, Nd, Sm.

In a particularly preferred embodiment at least one composite layer is provided on the surface of the substrate, preferably a composite layer of $Me_xE_yN_z$ with $x,y \geq 0$ and $z>0$, with Me being at least one metal of the group Al, Cr, Mo, W, V, Nb, Ta, Ti, Zr, HF, Mn, Fe; Co; Ni, Li, Be, Mg, Sc, Y, La, Ce, Nd, Sm and E being an element from the group consisting of Si, B, C, O.

For special applications a special layer system in accordance with the invention can also be provided with an additional hard layer of $Si_aB_bMe_cN_uC_vO_w$, in particular an additional hard layer of $Si_aB_bMe_cC_vN_u$ and especially an additional hard layer of $Si_aB_bC_vN_u$.

In a particularly preferred embodiment an AlTi hard layer with the composition $(Al_{1-\alpha-\beta}Ti_\alpha X_\beta)(N_{1-\gamma}CO_\delta B_\epsilon)$ with $0.2<\alpha<0.6$, $0 \leq \beta<0.2$ and $\alpha+\beta>0.01$ and $0 \leq \gamma<0.5$, $0 \leq \delta<0.5$, $0 \leq \epsilon<0.5$ and $\gamma+\delta+\epsilon>0.01$, is provided with X being an element of the group consisting of Zr, V, Cr, Nb, Ta; W; Mo; Hf, Mg Si, Y.

The functional layers on the basis of SiB are deposited in the range of the atomic composition of Si:B in the range of 9 to 0.1, with the most diverse compositions being presentable within a gradient layer or multi-layer layer. Boron-rich functional layers are preferably deposited, i.e. the Si content is smaller than the boron content. The composition with 6 boron atoms per Si atom is particularly interesting since then the particularly stable SiB6 structure can form in the functional layers, at least locally.

The addition of N, C; 0 leads to the formation of the most diverse bonding states in the functional layers thus B—N, B—C, Si—N, Si—C, Si—O, B—O bonds arise which are however complicated and costly to quantify. The covalent bond components (for example SiN and BC) bring about a high hardness. The structural mechanism and the bonding mechanism of these complex layers is not adequate with the present state of knowledge to make predictions concerning the complex layer characteristics.

In a preferred embodiment the atomic composition of the functional layers should consist of ca. the same proportions of Si and boron and N and/or mixtures of N, C, O. An overstoichiometric composition with respect to the content of N and C related to SiB is also worthwhile, which is however problematic to manufacture technically. For example, a layer composition of this kind having ca. the same proportions of Si, B and C but ca. a proportion of N which corresponds to three times the amount of Si would be expedient in accordance with bulk ceramics.

In the above described preferred compositions of the functional layers at least local highly stable compounds can form—in the form of $Si_3B_3N_7$ or $SiBN_3C$.

The oxygen contents in the functional layers are restricted to significantly under 50 at-%, preferably to around 10 at-% related to the total composition, because the ionic bonding proportion, which as a rule leads to brittle material behavior, should be restricted.

The proportions of metals in the functional layers are likewise expediently set at significantly below 50 at-%, and these are mainly restricted to a maximum of 10 at-%-in the intermediate layers. These proportions thereby serve as bonding bridges to the lower hard material layer or originate from the target binders.

The hardnesses of the functional layers thereby cover the range of ca. 1000 to 5000 Vickers, preferably between 2000 and 3500 Vickers. The selection of suitable layers depends on the respective tribological properties. By way of example, the friction is a determining factor for various micro-tools in order to avoid over-heating so that friction-reducing boron oxides are desirable with layer hardness around 1000 Vickers already being expedient. A tribological partition layer is important. In the presence of air humidity the boron oxide is converted to boric acid whereby low friction values can be achieved.

For ball mills (spherically shaped milling cutters) in contact with Ti alloys a high hardness level should instead be set.

An intermediate layer consisting of the elements Si and/or C can be provided not only but also to improve the bond characteristics to the substrate or to another layer of the layer system of the invention, for example on a particularly heavy loaded tool.

Moreover, in a further embodiment a gradient mixed layer can be provided which includes the elements Si and/or C of the intermediate layer and the composition $Si_aB_bMe_c N_uC_vO_w$, in particular $Si_aB_bMe_cC_vN_u$ and especially $Si_aB_b C_vN_u$ of the first hard layer. The composition of the gradient mixed layer can in this respect change more or less continuously from the composition of a first layer with which the gradient mixed layer is in contact to the composition of a second layer with which the gradient mixed layer is likewise in contact, so that the first and the second layers, which can for example have different chemical and/or physical properties such as lattice structure, crystallinity, thermal expansion, etc., can be ideally matched to one another.

An oxygen functional layer of $Si_aB_bMeN_uC_vO_w$ and especially an $Si_aB_bN_uC_vO_w$ oxygen functional layer can be particularly advantageously provided which can in particular be provided as a cover layer. This cover layer can for example prevent or minimize the diffusion of oxygen in the layer (but not only this) and thereby increase the oxidation resistance amongst other things. Moreover, the cover layer can protect the layer system against external attacks, in particular from the outside, especially by providing chemical, thermal and mechanical properties so that the layer system of the invention is, for example, particularly well protected against high temperature by the cover layer and/or has particularly advantageous mechanical properties or particularly good tribological properties. It will be understood that the previously described embodiments of the invention can also be combined in any suitable manner, depending on the application, and that the layer sequences which have been explained by way of example can in particular also be realized in another manner and one or more of the layers can be missing completely in a special embodiment of a layer system in accordance with the invention or can also be multiply present in another embodiment in one and the same layer system.

In a special case a layer thickness of the composite layer and/or of the intermediate layer and/or of the first hard layer and/or of the second hard layer and/or of the gradient mixed layer can lie between 0.1 μm and 50 μm, in particular between 1 μm and 15 μm and preferably between 5 μm and 8 μm.

A hardness HK 0.05 of the first hard layer and/or of the second hard layer preferably lies between 10 GPa and 50 GPa in particular between 25 GPa and 35 GPa and a residual compressive stress of the first hard layer and/or of the second hard layer lies between 0.1 GPa and 10 GPa and in particular between 1.5 GPa and 4 GPa.

An oxidation resistance and/or a phase stability of a layer system in accordance with the invention is in this respect guaranteed at temperatures greater than 700° C. in particular up to temperature greater than 1000° C.

For the application of a layer system in accordance with the invention the invention further relates to a first arc vaporization source having a vaporization material as a cathode for the generation of a surface layer on a surface of a substrate by vaporization of the vapor material by means of an arc discharge on a vaporization surface of the cathode. In this arrangement the vaporization material has a chemical composition $(Al_{a'}Mg_{b'}Cr_{c'}Me_{d'}B_{e'}AX_{m'}Si_{k'})$ with $(a'+b'+c'+d'+e'+m'+k')=100$, and with Me being at least one element of the group of the chemical elements consisting of the secondary groups IVb, Vb and VIb of the periodic system of the chemical elements. A is at least one element of the group of the chemical elements consisting of the elements of the main groups Ia, IIa and the elements of the secondary groups VIIb, VIIIb, Ib, IIb, IIIb and the elements of the group of the lanthanoids, of the periodic system of the chemical elements, wherein $0.01 \leq m' < 100$, preferably $0.012 \leq m' < 80$. In accordance with the invention the content of Al, Mg and Cr is restricted to $1 \leq a' \leq 97$ and $0.1 \leq b' \leq 20$ and $30 \leq c' \leq 70$.

In a special embodiment the arc vaporization source additionally contains C and/or N and/or O and, in an embodiment which is particularly important in practice, the component A can be a mixed metal.

In a special case the aluminum content lies in the range $50 \leq a' \leq 70$ and the magnesium content is restricted to a range $0.5 \leq b' \leq 10$. Preferably, but not necessarily, Me is present in the arc vaporization source in a quantity corresponding to $10 \leq d' \leq 80$ and the content of Si amounts at most to $k'=40$ in a cathode of the present invention.

In a special case the component A is only Li and/or Be and/or Ca and/or Si, and/or A is only Sc and/or Y and/or La and in another embodiment A is only at least one element from the group of the lanthanoids in particular only Ce.

The invention furthermore relates to a second arc vaporization source with a vaporization material as a cathode for the generation of a surface layer on a surface of a substrate by vaporization of the vaporization material by means of an arc discharge on a vaporization surface of the cathode, wherein the vaporization material has a chemical composition $(M_kSi_lA_m)$ with $(k+l+m)=100$, more precisely stated $(M_oSi_pAY_q)$ with $(o'+p'+q')=100$ and wherein M is at least one metal of the group of the chemical elements consisting of Al and the elements of the secondary groups IVb, Vb, VIb of the periodic system of the elements. The component A of the second arc evaporation source is at least one element of the group of the chemical elements consisting of Mn, Fe, Co, Ni, Cu and the elements of the secondary group IIIB, and the elements of the main groups IA, IIA and IIIA, and the elements of the group of the lanthanoids of the periodic system of the chemical elements.

In a preferred embodiment the second arc vaporization source can additionally contain C and/or N and/or O and/or the component A additional contains boron (B).

Preferably $0.1 \leq p' < 50$ and/or the condition $0.01 < q' < 10$ applies.

In an embodiment which is particularly important in practice the component AY of the second vaporization source is a mixed metal and/or AY is an element from the group of the chemical elements consisting of Y and the lanthanoids and is in particular Ce and/or La.

In a special case the component AY of the second vaporization source can be only Be and/or Ca and/or AY can in another embodiment be only Sc and/or Y and/or La.

In a special but important case AY is only at least one element from the group of the lanthanoids, in particular the component AY can consist only of Ce.

Moreover, the invention relates to a combination vaporization source with a vaporization material consisting of a vaporization material of the first vaporization source and of the second vaporization source.

Finally the invention relates also to a substrate in particular to a tool which is coated with a layer system in accordance with the present invention.

A tool in accordance with the invention can in this respect be an original or master tool, a mould, a press tool, a chip forming tool, in particular a drill, a milling cutter, an indexable cutting insert for a turning or milling process or a planing tool, a reshaping tool or a micro-tool, in particular a micro drill, a micro indexable cutting insert, a micro miller or another tool or micro tool or a plastic tool. A substrate coated in accordance with the invention can in addition be a part subjected to wear, in particular a part subjected to wear for an air or land-based turbine, for a motor, in particular for a combustion engine, especially for a seal, a gear, a piston, piston ring, a part subjected to wear for a textile machine or another part subjected to wear.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

The invention claimed is:

1. A layer system for the formation of a surface layer on a surface of a substrate, comprising:
   at least one first layer having the composition $(Al_aMg_bCr_cMe_dB_eAX_mSi_k)_\alpha(N_uC_vO_w)_\beta$ with $(a+b+c+d+e+m+k)=\alpha$, $(u+v+w)=\beta$, and $(\alpha+\beta)=100$, wherein $40 \leq \alpha \leq 60$ and wherein Me is at least one metal of the group of the chemical elements consisting of: the elements of the secondary groups IVb, Vb, VIb of the periodic system of elements;
   wherein AX is at least one element of the group of the chemical elements consisting of: the elements of the main group IA, the elements Be, Ca, Sr and Ba, the elements of the secondary groups VIIb, VIIIb, Ib, IIb and IIIb, and the elements of the group of the lanthanoids of the periodic system of chemical elements;
   wherein $0.004 \leq m < 60$, $0.4 \leq a \leq 58$, $0.04 \leq b \leq 12$ and $18 \leq c \leq 42$.

2. The layer system of claim 1, wherein $0.01 \leq m < 50$.

3. The layer system of claim 1, wherein at least one of $20 \leq a \leq 42$, $0.02 \leq b \leq 6$, Me is present in a quantity corresponding to $4 \leq d \leq 54$ in the hard layer, and Si is present in a quantity of at most $k=24$ in the hard layer.

4. The layer system of claim 1, wherein AX is at least one of Li, Be, Ca and Si.

5. The layer system of claim 1, wherein AX is at least one of Sc, Y and La.

6. The layer system of claim 1, wherein AX is at least one element of the group of the lanthanoids.

7. The layer system of claim 1, wherein AX is a mixed metal.

8. The layer system of claim 1, wherein the layer system includes at least one additional second layer of the composition $(M_oSi_pAY_q)_\gamma(N_rC_sO_t)_\delta$ with $(o+p+q)=\gamma$, $(r+s+t)=\delta$, and $(\gamma+\delta)=100$, wherein $40 \leq \gamma \leq 60$ and wherein M is at least one metal of the group of the chemical elements consisting of: Al and the elements of the secondary groups IVb, Vb, VIb of the periodic system of elements,
  wherein AY is at least one element of the group of the chemical elements consisting of: Mn, Fe, Co, Ni, Cu, the elements of the secondary group IIIB, the elements of the main group IA, IIA and IIIA and the elements of the group of the lanthanoids of the periodic system of chemical elements; and
  wherein either a) the at least one additional second layer is between the substrate and the at least one first layer or b) the at least one first layer is between the substrate and the at least one additional second layer.

9. The layer system of claim 8, wherein AY further contains boron.

10. The layer system of claim 8, wherein AY is an element of the group of the chemical elements consisting of Y and the lanthanoids.

11. The layer system of claim 8, wherein AY is an element of the group of the chemical elements consisting of Y and at least one of Ce and La.

12. The layer system of claim 8, wherein at least one of $0.04 \leq p \leq 30$ and $0.004 \leq q \leq 6$.

13. The layer system of claim 1, wherein the first hard layer is a terminal cover layer of the layer system.

14. The layer system of claim 8, wherein the second hard layer is a terminal cover layer of the layer system.

15. The layer system of claim 1, further comprising a functional layer; wherein the functional layer is provided on the substrate.

16. The layer system of claim 15, wherein the functional layer is a composite layer.

17. The layer system of claim 15, wherein the functional layer is a composite layer of $Met_xE_yN_z$, with $x>0$; $y \geq 0$ and $z>0$,
  wherein Met is at least one metal of the group Al, Cr, Mo, W, V, Nb, Ta, Ti, Zr, HF, Mn, Fe; Co, Ni, Li, Be, Mg, Sc, Y, La, Ce, Nd, Sm; and
  wherein E is an element of the group Si, B, C, O.

18. The layer system of claim 8, further comprising at least one of an intermediate layer and a gradient mixed layer,
  wherein the intermediate layer comprises at least one of Si and C, and
  wherein the gradient mixed layer comprises the at least one of Si and C of the intermediate layer, the composition $(Al_aMg_bCr_cMe_dB_eAX_mSi_k)_\alpha(N_uC_vO_w)_\beta$ of the first layer, and the composition $(M_oSi_pAY_q)_\gamma(N_rC_sO_t)_\delta$ of the second layer.

19. An arc vaporization source having a vaporization material as cathode for the generation of a surface layer on a surface of a substrate by vaporization of the vapor material by means of an arc discharge on a vaporization surface of the cathode, wherein the vaporization material has a chemical composition $(Al_{a'}Mg_{b'}Cr_{c'}Me_{d'}B_{e'}AX_{m'}Si_{k'})$ with $(a'+b'+c'+d'+e'+m'+k')=100$,
  wherein Me is at least one element of the group of the chemical elements consisting of the secondary groups IVb, Vb and VIb of the periodic system of the chemical elements, and
  wherein AX is at least one element of the group of the chemical elements consisting of the elements of the main group Ia, the elements Be, Ca, Sr, Ba, the elements of the secondary groups VIIb, VIIIb, Ib, IIb, IIIb and the elements of the group of the lanthanoids of the periodic system of the chemical elements,
  wherein $0.01 \leq m' < 100$,
  wherein $1 \leq a' \leq 97$, $0.1 \leq b' \leq 20$ and $30 \leq c' \leq 70$.

20. The arc vaporization source of claim 19, wherein $0.012 \leq m' < 80$.

21. The arc vaporization source of claim 19, wherein the vaporization material further comprises at least one of C, N and O.

22. The arc vaporization source of claim 19, wherein at least one of $50 \leq a' 70$, $0.5 \leq b' 10$, $10 \leq d' \leq 80$ and k' is at most equal to 40.

23. The arc vaporization source of claim 19, wherein AX is at least one of Li, Be, Ca and Si, or wherein AX is at least one of Sc, Y and La, or wherein AX is at least one element of the group of the lanthanoids, or wherein AX is a mixed metal.

24. An arc vaporization source having a vaporization material as a cathode for the generation of a surface layer on a surface of a substrate by vaporization of the vaporization material by means of an arc discharge on a vaporization surface of the cathode, wherein the vaporization material has a chemical composition $(M_{o'}Si_{p'}AY_{q'})$ with $(o'+p'+q')=100$, and
  wherein M is at least one metal of the group of the chemical elements consisting of Al and the elements of the secondary groups IVb, Vb, VIb of the periodic system of the elements and
  wherein AY is at least one element of the group of the chemical elements consisting of Mn, Fe, Co, Ni, Cu, the elements of the secondary group IIIB, the elements of the main group IA, IIA and IIIA and the elements of the group of the lanthanoids of the period system of the chemical elements.

25. A combination vaporization source having a vaporization material in accordance with claim 8.

26. A substrate coated with a layer system of claim 1, wherein the substrate is at least one of an original tool, a master tool, a mould, a press tool, a chip forming tool, a drill, a milling cutter, an indexable cutting insert, a planing tool, a reshaping tool, a micro-tool, a micro drill, a micro indexable cutting insert, a micro miller, a plastic tool, and a substrate of a part;
  wherein the substrate is a part subjected to wear from at least one of an air-based turbine, a land-based turbine, a motor, a combustion engine, a seal, a gear, a piston, a piston ring, a part subjected to wear in a textile machine, and a part generally subjected to wear.

27. The layer system of claim 8, wherein $0.01 \leq q \leq 10$.

28. A layer system for the formation of a surface layer on a surface of a substrate, comprising:
  at least one first layer having the composition $(Al_aMg_bCr_cMe_dB_eAX_mSi_k)_\alpha(N_uC_vO_w)_\beta$ with $(a+b+c+d+e+m+k)=\alpha$, $(u+v+w)=\beta$, and $(\alpha+\beta)=100$, wherein $40 \leq \alpha \leq 60$ and wherein Me is at least one metal of the group of the chemical elements consisting of: the elements of the secondary groups IVb, Vb, VIb of the periodic system of elements;
  wherein AX is at least one element of the group of the chemical elements consisting of: the elements of the main group IA, the elements Be, Ca, Sr and Ba, the elements of the secondary groups VIIb, VIIIb, Ib, IIb and IIIb, and the elements of the group of the lanthanoids of the periodic system of chemical elements;
  wherein $0.004 \leq m < 60$, $0.4 \leq a \leq 58$, $0.04 \leq b \leq 12$ and $18 \leq c \leq 42$, and
  wherein the layer system includes at least one additional second layer of the composition $(M_oSi_pAY_q)_\gamma(N_rC_sO_t)_\delta$ with $(o+p+q)=\gamma$, $(r+s+t)=\delta$, and $(\gamma+\delta)=100$, wherein $40 \leq y \leq 60$ and wherein M is at least one metal of the group of the chemical elements consisting of: Al and the elements of the secondary groups IVb, Vb, VIb of the periodic system of elements, wherein AY is at least one element of the group of the chemical elements consisting of: Mn, Fe, Co, Ni, Cu, the elements of the secondary group IIIB, the elements of the main group IA, IIA and IIIA and the elements of the group of the lanthanoids of the periodic system of chemical elements; and wherein either a) the at least one additional second layer is between the substrate and the at least one first layer or b) the at least one first layer is between the substrate and the at least one additional second layer.

29. A layer system for the formation of a surface layer on a surface of a substrate, comprising:

at least one first layer having the composition $(Al_a Mg_b Cr_c Me_d B_e AX_m Si_k)_\alpha (N_u C_v O_w)_\beta$ with $(a+b+c+d+e+m+k)=\alpha$, $(u+v+w)=\beta$, and $(\alpha+\beta)=100$, wherein $40 \leq \alpha \leq 60$ and wherein Me is at least one metal of the group of the chemical elements consisting of: the elements of the secondary groups IVb, Vb, VIb of the periodic system of elements;

wherein AX is at least one element of the group of the chemical elements consisting of: the elements of the main group IA, the elements Be, Ca, Sr and Ba, the elements of the secondary groups VIIb, VIIIb, Ib, IIb and IIIb, and the elements of the group of the lanthanoids of the periodic system of chemical elements;

wherein $0.004 \leq m < 60$, $0.4 \leq a \leq 58$, $0.04 \leq b \leq 12$ and $18 \leq c \leq 42$, and further comprising a functional layer; wherein the functional layer is provided on the substrate.

* * * * *